(12) United States Patent
Du Plessis

(10) Patent No.: US 8,362,679 B2
(45) Date of Patent: Jan. 29, 2013

(54) SILICON LIGHT EMITTING DEVICE WITH CARRIER INJECTION

(75) Inventor: Monuko Du Plessis, Pretoria (ZA)

(73) Assignee: Insiava (Pty) Limited, Pretoria (ZA)

( * ) Notice: Subject to any disclaimer, the term of this patent is extended or adjusted under 35 U.S.C. 154(b) by 74 days.

(21) Appl. No.: 12/734,050

(22) PCT Filed: Oct. 8, 2008

(86) PCT No.: PCT/IB2008/054122
§ 371 (c)(1),
(2), (4) Date: Oct. 1, 2010

(87) PCT Pub. No.: WO2009/047716
PCT Pub. Date: Apr. 16, 2009

(65) Prior Publication Data
US 2011/0012502 A1   Jan. 20, 2011

(30) Foreign Application Priority Data
Oct. 8, 2007   (ZA) .................................. 2007/08559

(51) Int. Cl.
*F21K 2/08*   (2006.01)
(52) U.S. Cl. .............................. 313/358; 257/98; 257/99
(58) Field of Classification Search .................. 313/358; 257/98, 99
See application file for complete search history.

(56) References Cited

U.S. PATENT DOCUMENTS

| | | | |
|---|---|---|---|
| 4,861,731 A * | 8/1989 | Bhagat .......................... | 438/135 |
| 6,111,271 A | 8/2000 | Snyman et al. | |
| 6,365,951 B1 | 4/2002 | Worley .......................... | 257/438 |
| 2005/0062412 A1* | 3/2005 | Taniguchi et al. ........... | 313/512 |
| 2008/0128713 A1 | 6/2008 | Saito et al. | |

FOREIGN PATENT DOCUMENTS
WO    WO 02/097894    12/2002

OTHER PUBLICATIONS

Snyman et al. (Three Terminal n+ppn Silicon CMOS Light Emitting Devices with Three Order Increase in Quantum Efficiency (Industrial Electronics, 2005. ISIE 2005, vol. 3, p. 1159-1166).*

Du Plessis M. et al., "A silicon transconductance light emitting device (TRANSLED)", Sensors and Actuators A., vol. 80, No. 1, (Mar. 1, 2000), pp. 242-248.

International Search Report for PCT/IB2008/054122, mailed Feb. 27, 2009.

Du Plessis M et al., A Silicon transconductance Light Emitting Device (TRANSLED) Sensors and Actuators A, Elsevier Sequoia S.A., Lausanne, CH, vol. 80, No. 3, Mar. 1, 2000, pp. 242-248, XP004192113, ISSN 0924-4247.

* cited by examiner

*Primary Examiner* — Anh Mai
*Assistant Examiner* — Andrew Coughlin
(74) *Attorney, Agent, or Firm* — Nixon & Vanderhye PC

(57) ABSTRACT

A light emitting device (10) comprises a first body (12) of an indirect bandgap semiconductor material. A first junction region (18) in the body is formed between a first region (12.1) of the body of a first doping kind and a second region (12.2) of the body of a second doping kind. A second junction (20) region in the body is formed between the second region of the body and a third region of the body of the first doping kind. The first and second junction regions being spaced from one another by not further than a minority carrier diffusion length. A terminal arrangement is connected to the first, second and third regions of the body for, in use, reverse biasing the first junction region into avalanche or field emission mode and for forward biasing the second junction region to inject carriers into the first junction region. A second body (22) of an isolation material is located immediately adjacent at least one wall of the third region, thereby to reduce parasitic injection from the third region.

11 Claims, 5 Drawing Sheets

SILICON LIGHT EMITTING DEVICE WITH CARRIER INJECTION

This application is the U.S. national phase, under 35 U.S.C. §371, of International Application No. PCT/IB2008/054122, filed 8 Oct. 2008, which claims priority to South Africa Application No. 2007/08559, filed 8 Oct. 2007, the entire contents of each of which are hereby incorporated herein by reference.

INTRODUCTION AND BACKGROUND

This invention relates to optoelectronic devices and more particularly to a light emitting device fabricated from an indirect bandgap semiconductor material and to a method of generating light in an indirect bandgap semiconductor material.

A multi-terminal light emitting device fabricated form an indirect bandgap semiconductor material, such as silicon, is disclosed in U.S. Pat. No. 6,111,271. The multi-terminal device comprises a first pn-junction and a second pn-junction. Terminals are provided, in use, to reverse bias the first junction into avalanche or field emission mode to generate light and to forward bias the second junction, to inject "cool" carriers into the avalanching or field emission region, thereby to cause radiative recombination of the "cool" carriers and "hot" carriers energized by the avalanching or field emission and to increase the light generation efficiency of the device.

However, in devices fabricated in accordance with a standard CMOS process, it has been found that due to the lateral layout of such devices, a limited percentage of the injected carriers reaches the region of the reverse biased junction that is in avalanche or field emission breakdown. A majority of injected carriers are injected via a bottom wall of the second junction vertically into the bulk material to recombine in the bulk or laterally in other directions via sidewalls of the second junction, so that only a fraction of the injected carriers reach the region of the reverse biased junction that is in avalanche or field emission breakdown.

Another problem is that buried oxide isolation regions in the bulk material, a typical result of local oxidation or shallow trench isolation techniques, which regions are used to reduce the sidewall effect of the junctions, may shield injected carriers from the avalanche or field emission region, thereby further reducing the number of injected carriers that reach the avalanche or field emission region.

OBJECT OF THE INVENTION

It is an object of the present invention to provide an alternative light emitting device and method of generating light with which the applicant believes the aforementioned disadvantages may at least be alleviated.

SUMMARY OF THE INVENTION

According to the invention there is provided a light emitting device comprising:
a first body of an indirect bandgap semiconductor material;
a first junction region in the body formed between a first region of the body of a first doping kind and a second region of the body of a second doping kind;
a second junction region in the body formed between the second region of the body and a third region of the body of the first doping kind;
the first and second junction regions being spaced from one another by not further than a minority carrier diffusion length;
a terminal arrangement connected to the first, second and third regions of the body for, in use, reverse biasing the first junction region into avalanche or field emission mode and for forward biasing the second junction region to inject carriers into the first junction region; and
a second body of an isolation material immediately adjacent at least one wall of the third region, thereby to reduce parasitic injection from the third region.

The first and second junction regions may be aligned. The first and second junction regions are preferably axially aligned and extend parallel to one another to face one another.

The first body may be encapsulated in the second body.

The first body may be encapsulated in the second body utilizing Silicon on isolator (SOI) Complementary Metal Oxide Semiconductor (CMOS) technology.

The second body may be provided on a surface of a body of bulk material; the first and second junction regions may extend between opposed first and second walls of the first body and the second wall may be located between the first wall and the surface.

A buried part or wall of the second body may space the second wall of the first body from the surface of the layer of bulk material.

The buried wall may be configured to act as a reflector for photons propagating towards the bulk material.

The first wall of the first body may be concave in transverse cross section. The first wall may be radiussed in transverse cross section.

According to another aspect of the invention a method of generating light in a indirect bandgap semiconductor material comprises the steps of:
utilizing a first junction region in a first body of an indirect bandgap semiconductor material formed between a first region of the body of a first doping kind and a second region of the body of a second doping kind; and a second junction region in the body formed between the second region of the body and a third region of the body of the first doping kind;
reverse biasing the first junction region into avalanche or field emission mode, to cause light to be generated;
forward biasing the second junction region to inject carriers into the first junction region; and
utilizing termination by a second body of an isolation material of at least one wall of the third region to reduce parasitic injection from the third region.

Yet further included within the scope of the present invention is a light emitting device comprising:
a first body of an indirect bandgap semiconductor material;
a first junction region in the body formed between a first region of the body of a first doping kind and a second region of the body of a second doping kind;
a terminal arrangement connected to the first and second regions of the body for, in use, reverse biasing the first junction region into avalanche or field emission mode; and
a second body of an isolation material immediately adjacent at least one wall of the first region.

Still further included within the scope of the present invention is a method of generating light in an indirect bandgap semiconductor material, the method comprising the steps of:
utilizing a first junction region in a first body of an indirect bandgap semiconductor material formed between a first region of the body of a first doping kind and a second region of the body of a second doping kind;
reverse biasing the first junction region into avalanche or field emission mode, to cause light to be generated;
utilizing termination by a second body of an isolation material of at least one wall of the first region to reduce parasitic injection from the first region.

BRIEF DESCRIPTION OF THE ACCOMPANYING DIAGRAMS

The invention will now further be described, by way of example only, with reference to the accompanying diagrams wherein.

DESCRIPTION OF A PREFERRED EMBODIMENT OF THE INVENTION

Figure 1:
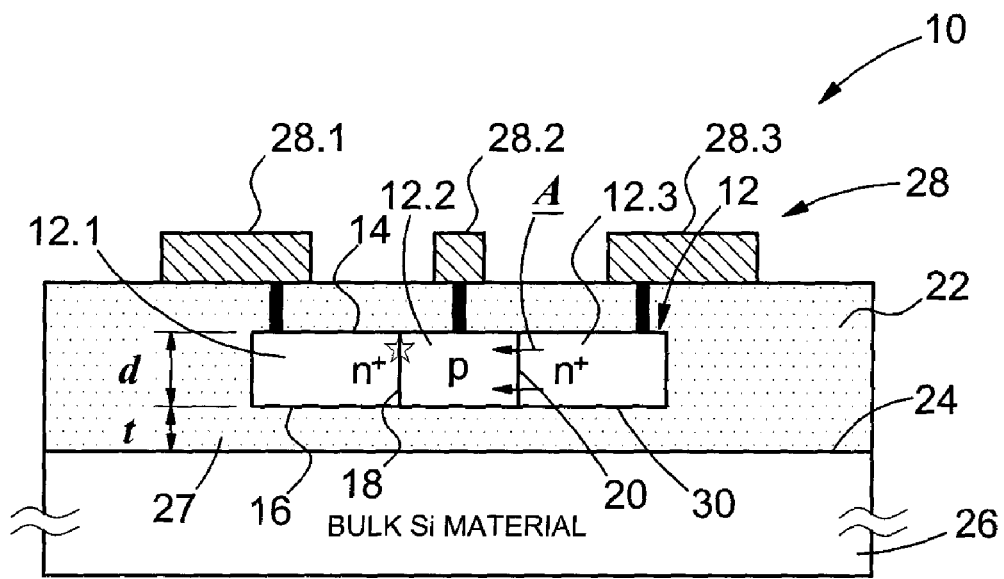
FIG. 1 is a cross section through a first embodiment of a light emitting device fabricated from an indirect bandgap semiconductor material.
Figure 2:
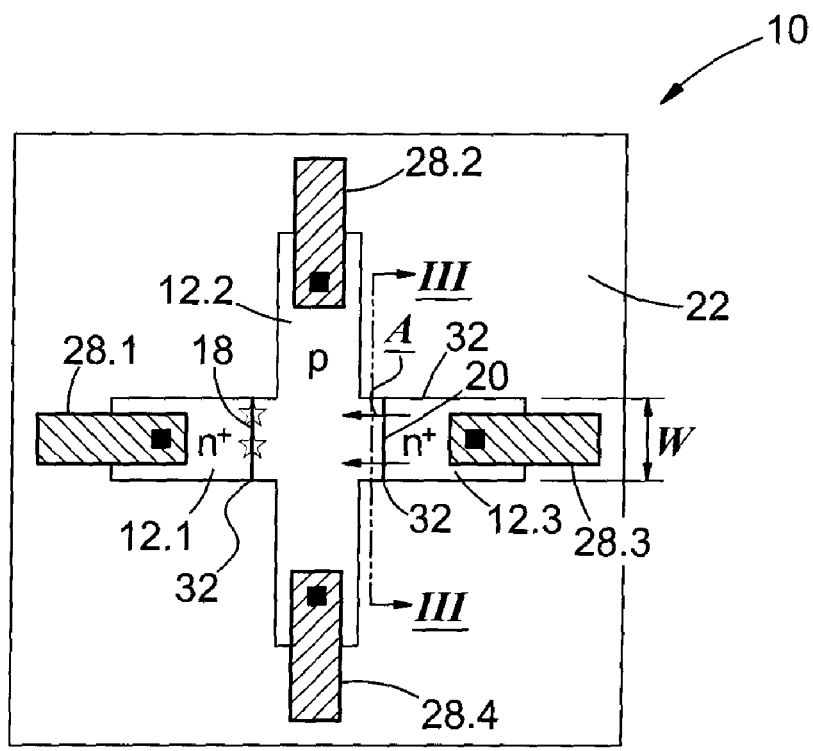
FIG. 2 is a plan view of relevant parts of the device.

A multi-terminal light emitting device fabricated from an indirect bandgap semiconductor material, such as Si, Ge and Si—Ge, is generally designated by the reference numeral 10 in FIGS. 1 and 2. The device comprises a first body 12 of the indirect bandgap semiconductor material, in this case Si. The first body has a thickness dimension d (typically less than 10 nm), and in relevant parts thereof has a width dimension w (typically less than 100 nm), is generally rectangular in transverse cross section and has a first or top wall 14, a second or bottom wall 16 and sidewalls 32, shown in FIG. 2. The first body provides a first junction region 18 between a first region 12.1 of the body of a first doping kind and a second region 12.2 of the first body of a second doping kind. The first body further comprises a second junction region 20 between the second region 12.2 and a third region 12.3 of the first body, also of the first doping kind. The first doping kind may be n+ and the second doping kind may be p. In other embodiments opposite doping kinds may be used.

As shown in FIGS. 1 and 2, each of the first and second junction regions extends between the top wall 14 and the bottom wall 16 and the two junction regions may be in line, preferably axially in line and substantially parallel to one another, to face one another. In other embodiments, the junction regions may not be in line. However, the junction regions are spaced from one another by not more than a minority carrier diffusion length.

At least one, preferably more of a top wall, a bottom wall, and sidewalls of the third region 12.3 is bordered or terminated by a second body 22 of an isolation material, such as silicon dioxide, located immediately adjacent the relevant wall(s). In a preferred embodiment, the first body 12 is encapsulated in the second body 22. The first body 12 may be so encapsulated in the second body 22 utilizing so-called Silicon on isolator (SOI) Complementary Metal Oxide Semiconductor (CMOS) technology. The second body is provided on a surface 24 of bulk silicon 26. A buried silicon dioxide wall 27 with thickness t spaces the bottom wall 16 of the first body 12 from the bulk material. Hence, the third region 12.3 does not have a bottom wall to the bulk and the sidewalls are terminated by oxide at 32, so that sidewall effects are reduced.

Suitable electrical terminals 28.1 to 28.3 of a terminal arrangement 28 are connected to the first region 12.1, second region 12.2 and third region 12.3 respectively. In use, the first junction region 18 is reverse biased into a light generating avalanche or field emission mode and the second junction is forward biased, to inject "cool" carriers into the light generating first junction region 18, as will hereinafter be described. This will encourage recombination of "hot" energetic carriers, energized as a result of the large electric fielding of the reverse biased junction 18, with "cool" carriers of the opposite type (for example, "hot" holes and "cool" electrons) injected from the forward biased junction. The bias of the junction regions 18 and 20 are preferably separately controllable.

As stated hereinbefore, the second pn-junction 20 has a substantially two-dimensional geometry. If the junction is forward biased, carriers will be injected across the area w×d, in one direction A, as shown in FIGS. 1 and 2. This means that substantially all the carriers are directed in one direction A, and losses due to parasitic bottom injection at 30 (shown in FIG. 1) and sidewall injection at 32 (shown in FIG. 2) are reduced or eliminated.

The dimensions of w and d may be selected for carrier confinement and high current densities, to increase the quantum efficiency.

Figure 3:
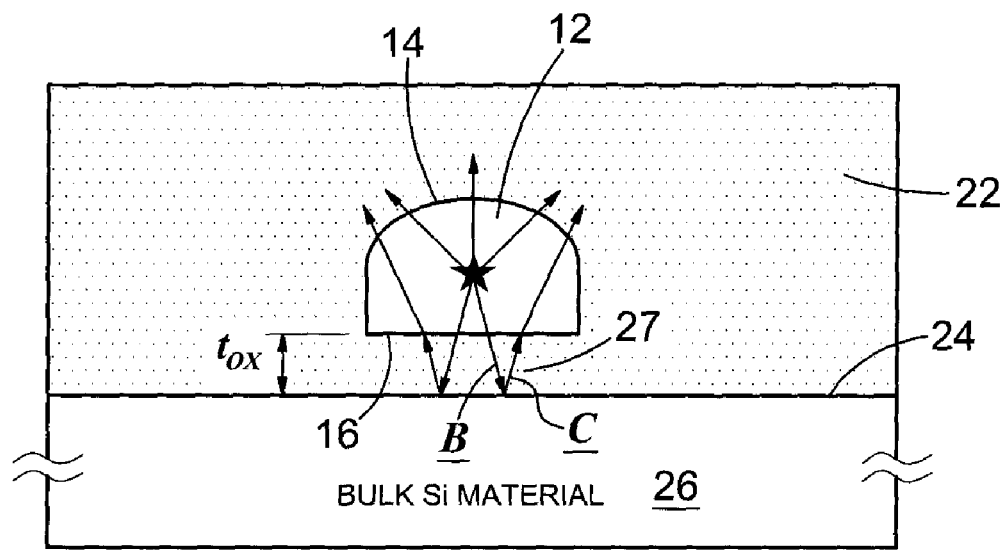
FIG. 3 is a section on line III in FIG. 2.

Referring to FIG. 3, the light emission of the device 10 may be improved by providing the top wall 14 of the first body 12 with a concave profile in transverse cross section. In a preferred embodiment, the profile is radiussed to limit internal reflections and to transmit photons through the top wall 14, to be perceived or detected. The radiussed shape may be achieved with wet chemical etching of the aforementioned rectangular profile, or thermal oxidation of the rectangular profile. Furthermore, the thickness $t_{ox}$ of the buried layer 27 may be chosen to have a maximum reflective characteristic at an emitted wavelength of interest, so that a large proportion of photons of the desired wavelength, which are emitted downwards in direction B towards the bulk 26, are reflected back in direction C towards and through the top wall 14.

Figure 4:
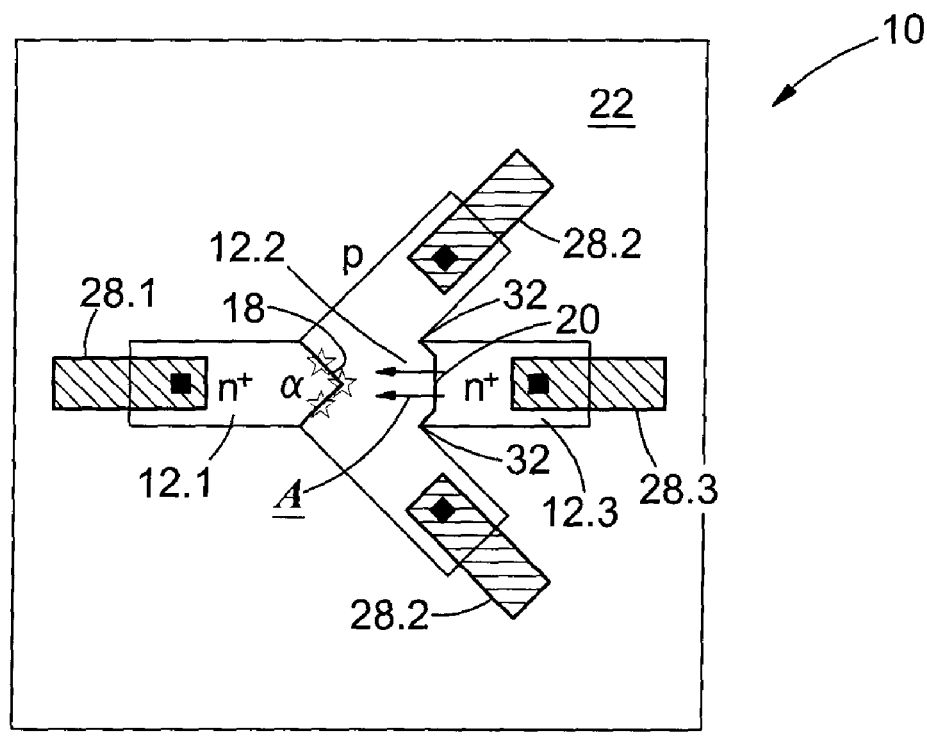
FIG. 4 is a plan view of relevant parts of a second embodiment of the light emitting device.

It is believed that recombination of injected carriers in the p-type material 12.2 before they reach the reverse biased junction 18 should be small, since the spacing or distance between the two junctions 18 and 20 is not further than a minority carrier diffusion length, typically about equal to the width w of the first body, which in modern technologies, may be limited to less than 100 nm. However, some of the injected carriers may diffuse towards the p-type contact 28.2 and hence away from the first junction 18. This may be mitigated, reduced or eliminated by appropriate geometries, such as that shown in FIG. 4, wherein reference numerals similar to that in FIGS. 1 and 2 are used, to designate like parts or features. In this embodiment, first junction region 18 defines an acute angle α and second junction region 20 is set back in body 12 from p-type branches extending to the contacts 28.2 at about 45 degrees.

The stimulated recombination of "hot" and "cool" carriers is expected to increase the efficiency of the light generation mechanism. It is has been shown that there may be two light generating mechanisms. The first is centred at about 2 eV and is known. The second, which has not yet been reported, peaks at about 2.8 eV. The aforementioned carrier injection increases this photon generation component at about 2.8 eV (about 450 nm wavelength), which makes it more efficient and can act as a source of blue light in silicon.

Figure 5:
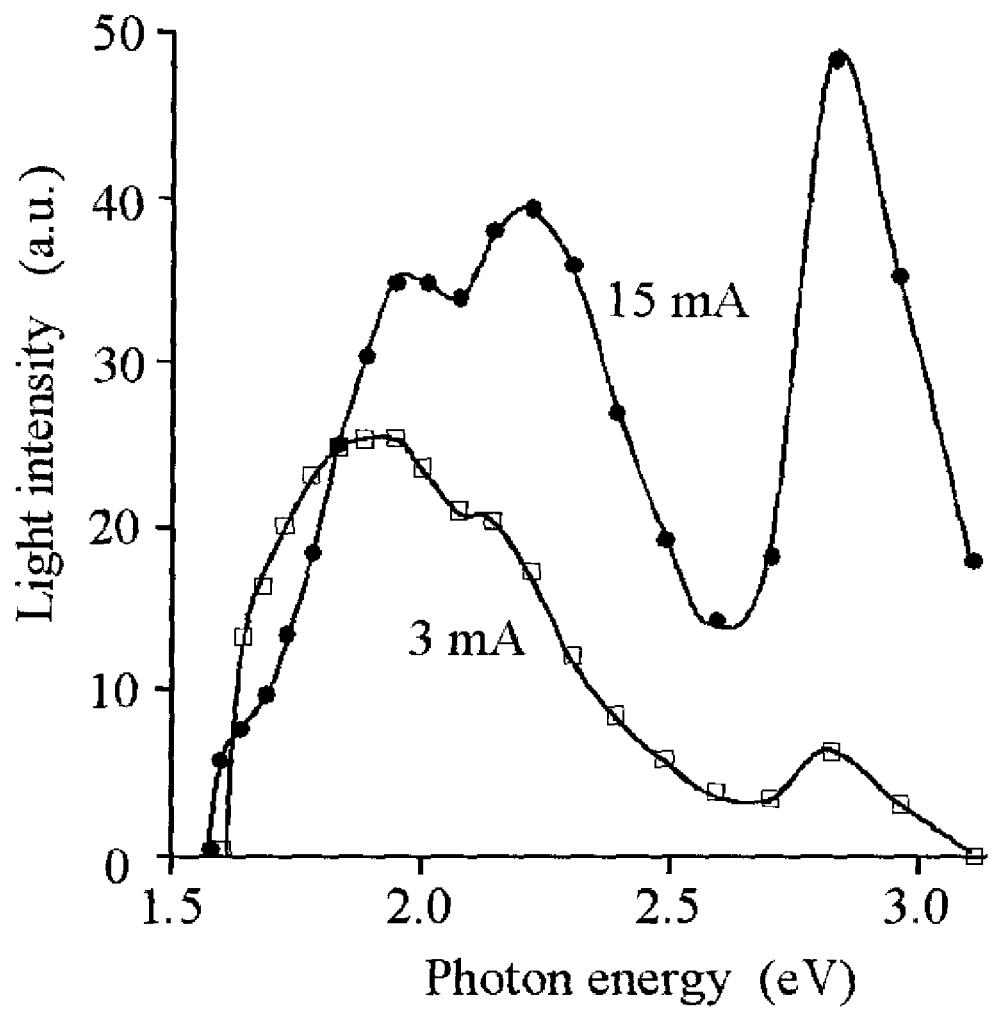
FIG. 5 is a graph of light intensity against photon energy.
Figure 6:
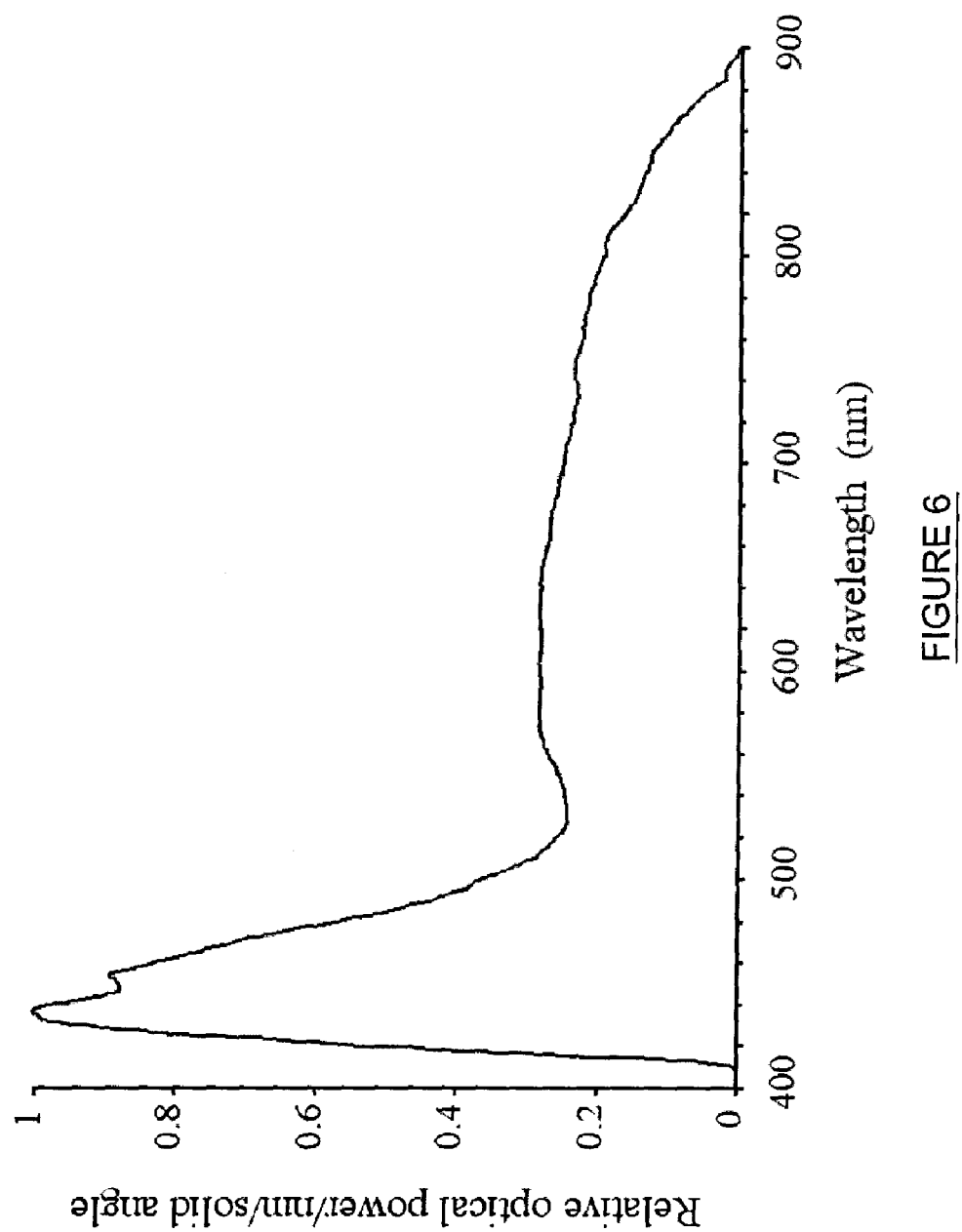
FIG. 6 is a graph of relative optical power against wavelength for the device.

The spectra of silicon carrier injection devices are shown in FIG. 5, indicating the strong 2.8 eV photon energy emission with carrier injection. The wavelength spectrum is shown in FIG. 6, showing the peak at about 450 nm.

Figure 7:
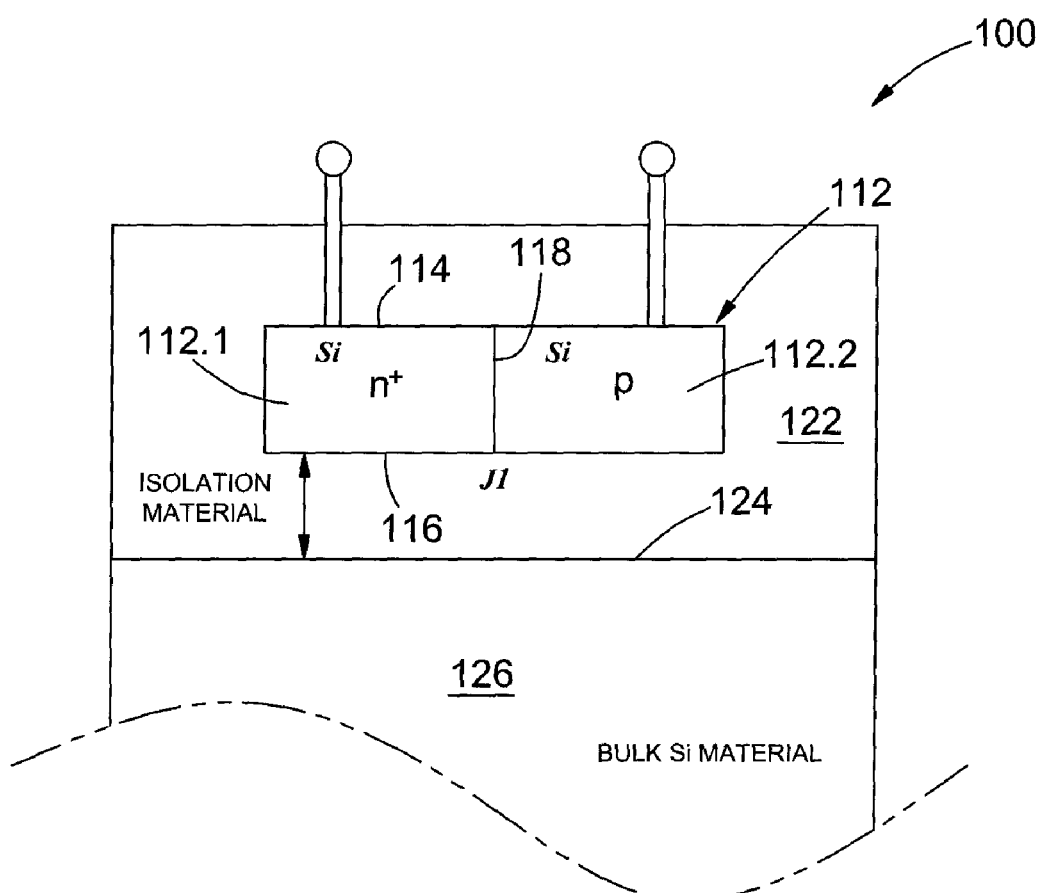
FIG. 7 is a view similar to FIG. 1 of another embodiment of the light emitting device.

The invention also includes within its scope a device 100 as shown in FIG. 7. The device 100 comprises a first body 112 of the indirect bandgap semiconductor material. The first body provides a first junction region 118 between a first region 112.1 of the first body of a first doping kind and a second region 112.2 of the first body of a second doping kind. At least one, preferably more of a top wall 114, a bottom wall 116 and sidewalls of the first region 112.1 is bordered or terminated by a second body 122 of an isolation material, such as silicon dioxide, located immediately adjacent the aforementioned walls. In a preferred embodiment, the first body 112 is encapsulated in the second body 122, utilizing so-called Silicon on Isolator (SOI) Complementary Mosfet Oxide Semiconductor (CMOS) technology. The second body 122 is provided on a surface 124 of bulk silicon 126.

The invention claimed is:

1. A light emitting device comprising:
   a first body of an indirect bandgap material;
   a first junction region in the first body formed between a first region of the body of a first doping kind and a second region of the body of a second doping kind;
   a second junction region in the first body formed between the second region of the body and a third region of the first body of the first doping kind;
   the first and second junction regions being spaced from one another by not further than a minority carrier diffusion length;
   a terminal arrangement connected to the first, second and third regions of the first body for, in use, reverse biasing the first junction region into avalanche or field emission mode and for forward biasing the second junction region to inject carriers into the first junction region; and
   a second body of an isolation material immediately adjacent at least part of each of at least two of a top wall, a bottom wall and sidewalls of the third region of the first body, thereby to reduce parasitic injection from the first body.

2. The light emitting device as claimed in claim 1 wherein the first body is encapsulated in the second body.

3. The light emitting device as claimed in claim 2 wherein the first body is encapsulated in the second body utilizing Silicon on isolator (SOI) Complementary Metal Oxide Semiconductor (CMOS) technology.

4. The light emitting device as claimed in claim 2 wherein the second body is provided on a surface of a body of bulk material; wherein the first and second junction regions extend between opposed first and second walls of the first body and with the second wall located between the first wall and the surface.

5. The light emitting device as claimed in claim 4 wherein a buried wall of the second body spaces the second wall of the first body from the surface of the layer of bulk material.

6. The light emitting device as claimed in claim 5 wherein the buried wall acts as a reflector for photons propagating towards the bulk material.

7. The light emitting device as claimed in claim 4 wherein the first wall of the first body is concave in transverse cross section.

8. The light emitting device as claimed in claim 7 wherein the first wall is radiussed in transverse cross section.

9. A method of generating light in an indirect semiconductor bandgap material, the method comprising the steps of:
   utilizing a first junction region in a first body of an indirect bandgap semiconductor material formed between a first region of the first body of a first doping kind and a second region of the first body of a second doping kind; and a second junction region in the body formed between the second region of the first body and a third region of the first body of the first doping kind;
   reverse biasing the first junction region into avalanche or field emission mode, to cause light to be generated;
   forward biasing the second junction region to inject carriers into the first junction region; and
   utilizing termination by a second body of an isolation material of at least part of each of at least two of a top wall, bottom wall and sidewalls of the third region of the first body, thereby to reduce parasitic injection from the first body.

10. A light emitting device comprising:
    a first body of an indirect bandgap semiconductor material;
    a first junction region in the body formed between a first region of the first body of a first doping kind and a second region of the first body of a second doping kind;
    a terminal arrangement connected to the first and second regions of the first body for, in use, reverse biasing the first junction region into avalanche or field emission mode; and
    a second body of an isolation material immediately adjacent at least part of each of at least of a top wall, a bottom wall and sidewalls of the first region of the first body to reduce parasitic injection from the first body.

11. A method of generating light in an indirect bandgap semiconductor material, the method comprising the steps of:
    utilizing a first junction region in a first body of an indirect bandgap semiconductor material formed between a first region of the first body of a first doping kind and a second region of the first body of a second doping kind;
    reverse biasing the first junction region into avalanche or field emission mode, to cause light to be generated;
    utilizing termination by a second body of an isolation material of at least part of each of at least two of a top wall, a bottom wall and sidewalls of the first region of the first body to reduce parasitic injection from the first body.

* * * * *